(12) United States Patent
Han et al.

(10) Patent No.: US 11,259,426 B2
(45) Date of Patent: Feb. 22, 2022

(54) ROLLABLE DISPLAY DEVICE (71) Applicant: LG ELECTRONICS INC., Seoul (KR)

(72) Inventors: Dongkyoon Han, Seoul (KR); Kyungmin Jeong, Seoul (KR); Taesung Cha, Seoul (KR); Heegun Park, Seoul (KR); Hyeongjun Kwon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/886,680

(22) Filed: May 28, 2020

(65) Prior Publication Data
US 2021/0068280 A1 Mar. 4, 2021

(30) Foreign Application Priority Data
Sep. 3, 2019 (WO) ................ PCT/KR2019/011282

(51) Int. Cl.
H05K 5/02 (2006.01)
G06F 1/16 (2006.01)
H05K 5/00 (2006.01)

(52) U.S. Cl.
CPC ......... H05K 5/0217 (2013.01); H05K 5/0017 (2013.01)

(58) Field of Classification Search
None
See application file for complete search history.

(56) References Cited

U.S. PATENT DOCUMENTS 7,463,238 B2 * 12/2008 Funkhouser .......... G06F 1/1601
345/107
10,101,019 B2 * 10/2018 Jahng .................. F21V 33/0052
(Continued)

FOREIGN PATENT DOCUMENTS

KR 1020140101611 8/2014
KR 1020160099998 8/2016
(Continued)

OTHER PUBLICATIONS

PCT International Application No. PCT/KR2019/011282, Notification of Transmittal of the International Search Report and the Written Opinion of the International Searching Authority, or Declaration dated Jun. 2, 2020, 9 pages.

Primary Examiner — Xanthia C Cunningham
(74) Attorney, Agent, or Firm — Lee, Hong, Degerman, Kang & Waimey PC (57) ABSTRACT A rollable display device includes: a soft display panel; a main roller for winding or unwinding the soft display panel; an actuator coupled to the soft display panel to ascend and descend the soft display panel; a housing having the main roller mounted therein, wherein an opening extending in a first direction is defined in a top of the housing to retract and extend the soft display panel therethrough; and an elastic portion having one end coupled to a perimeter of the opening and protruding to cover at least a portion of the opening, wherein the elastic portion includes a rubber portion having a predetermined length along the first direction. The rollable display device may minimize exposure of an interior of the housing to prevent foreign substances from entering.

19 Claims, 6 Drawing Sheets (56) References Cited

U.S. PATENT DOCUMENTS

| | | | |
|---|---|---|---|
| 10,347,160 B2* | 7/2019 | Takayanagi | G09F 11/29 |
| 2010/0182738 A1* | 7/2010 | Visser | G06F 1/1613 |
| | | | 361/679.01 |
| 2011/0132557 A1* | 6/2011 | Kuroi | G03B 21/58 |
| | | | 160/368.1 |
| 2012/0200915 A1* | 8/2012 | Kuroi | G03B 21/58 |
| | | | 359/443 |
| 2014/0092566 A1* | 4/2014 | Shirasaka | H05K 5/0017 |
| | | | 361/749 |
| 2017/0325343 A1* | 11/2017 | Seo | H05K 5/03 |
| 2018/0070467 A1* | 3/2018 | Kim | H05K 5/0247 |
| 2018/0225804 A1* | 8/2018 | Lu | H05K 5/0017 |
| 2018/0376603 A1* | 12/2018 | Lee | G06F 1/1652 |
| 2019/0064578 A1 | 2/2019 | Cho | |
| 2019/0261520 A1* | 8/2019 | Wang | F16C 13/00 |

FOREIGN PATENT DOCUMENTS

| | | |
|---|---|---|
| KR | 1020180128243 | 12/2018 |
| KR | 1020190051541 | 5/2019 |

* cited by examiner

ROLLABLE DISPLAY DEVICE

CROSS-REFERENCE TO RELATED APPLICATIONS

Pursuant to 35 U.S.C. § 119 (a), this application claims the benefit of an earlier filing date and right of priority to International Application No. PCT/KR2019/011282, filed on Sep. 3, 2019, the contents of which are hereby incorporated by reference herein in its entirety.

BACKGROUND

Field

The present disclosure relates to a rollable display device that blocks a gap between a soft display panel and a housing when the soft display panel is retracted and extended, thereby covering an interior of the housing and preventing foreign substances from entering.

Discussion of the Related Art

Generally, a display device using a flat display panel, such as a liquid crystal display device, an organic light emitting display device, an LED display device, an electrophoretic display device, or the like is mainly applied to a laptop, a portable electronic device, a television, a monitor, and the like.

A conventional flat display panel uses a glass substrate having no inflexibility, which limits application and use thereof. Thus, in recent years, a rollable display device that may be bent using a flexible substrate such as plastic and the like instead of the glass substrate having no flexibility is attracting attention as a new display.

Recently, a rollable display device in which a soft display panel is retracted and extended through an opening defined in a top of a housing has been released.

In a case of such rollable display device, the opening is generally defined wider than a passage area of the soft display panel to protect the soft display panel.

However, in the conventional rollable display device, when the soft display panel is retracted and extended, a gap is defined between the soft display panel and the housing, so that an internal structure of the device is exposed and foreign substances are easily flowed into the device.

In addition, grease applied to a joint gear and the like of an actuator for ascending and descending of the soft display panel is easily transferred to other portions of the device, which makes maintenance cumbersome.

SUMMARY OF THE DISCLOSURE

An embodiment of the present disclosure aims to provide a rollable display device that may block external foreign substances by minimizing exposure of an interior of a housing when a soft display panel is retracted and extended.

Another embodiment of the present disclosure aims to provide a rollable display device that may prevent a brush from entering an actuating member ascending and descending a soft display panel.

One aspect of the present disclosure proposes a rollable display device including a soft display panel, a main roller for winding or unwinding the soft display panel, an actuator coupled to the soft display panel to ascend and descend the soft display panel, a housing having the main roller mounted therein, wherein an opening extending in a first direction is defined in a top of the housing to retract and extend the soft display panel therethrough, and an elastic portion having one end coupled to a perimeter of the opening and protruding to cover at least a portion of the opening, wherein the elastic portion may include a rubber portion having a predetermined length along the first direction.

In one implementation, the elastic portion may protrude in a second direction perpendicular to the first direction.

In one implementation, the rubber portion may include a connecting portion coupled to the housing, and a wing portion flatly extending from the connecting portion to cover at least a portion of the opening.

In one implementation, a thickness of the wing portion may increase as the wing portion becomes closer to the connecting portion.

In one implementation, the wing portion may include at least one cut defined therein extending from an end of the wing portion toward the connecting portion.

In one implementation, the connecting portion may include a hollow defined therein to pivotably connect the other end of the wing portion to the housing.

In one implementation, the actuator may include a link assembly retracted and extended through the opening in conjunction with the soft display panel, and a link actuator for actuating the link assembly to ascend and descend the soft display panel, wherein the link assembly may include an upper link frame having an upper end connected to an upper portion of the soft display panel, a lower link frame having a lower end connected to the link actuator, and a link joint for connecting a lower end of the upper link frame and an upper end of the lower link frame with each other, wherein the link joint forms a predetermined angle between the upper link frame and the lower link frame as the soft display panel ascends or descends.

In one implementation, the link joint may move along a pivot path having a predetermined pivot radius with respect to the lower end of the lower link frame, and wherein the rubber portion may be located on the pivot path of the link joint.

In one implementation, the elastic portion may further include a brush having one end coupled to the perimeter of the opening and having a plurality of bristles for covering at least a portion of the opening.

In one implementation, the link joint may include a first gear positioned on the lower end of the upper link frame, and a second gear positioned on the upper end of the lower link frame and rotating in engagement with the first gear, and wherein the length of the rubber portion in the first direction may be larger than a length of the link joint in the first direction.

According to an embodiment of the present disclosure, the rollable display device of the present disclosure may block the external foreign substances by minimizing the exposure of the interior of the housing when the soft display panel is retracted and extended.

According to another embodiment of the present disclosure, the rollable display device of the present disclosure may prevent the brush from entering the actuating member ascending and descending the soft display panel.

A further scope of applicability of the present disclosure will become apparent from a detailed description below. However, various changes and modifications within the spirit and scope of the present disclosure may be clearly understood by those skilled in the art, so that it is to be understood that the specific embodiments, such as the detailed description and the preferred embodiments of the present disclosure, are given by way of example only.

DETAILED DESCRIPTION OF THE DISCLOSURE

Hereinafter, embodiments disclosed herein will be described in detail with reference to the accompanying drawings, and the same or similar components will be given the same reference numerals regardless of the reference numerals, and redundant description thereof will be omitted. The suffixes "module" and "unit" for components used in the following description are given or mixed in consideration of only ease of specification, and do not have distinct meanings or roles from each other. In addition, in describing the embodiments disclosed herein, when it is determined that a detailed description of a related known technology may obscure the subject matter of the embodiments disclosed herein, the detailed description thereof will be omitted. Further, the accompanying drawings are used to help easily understand the embodiments disclosed herein and it should be understood that technical ideas disclosed herein are not limited by the accompanying drawings, and all alterations, equivalents, and substitutes included in the spirit and technical scope of the present disclosure are included.

Although the terms including ordinal numbers, such as first, second, etc. may be used to describe various components, these components should not be limited by these terms. These terms are only used to distinguish one component from another.

It will be understood that when a component is referred to as being "connected with" another component, the component can be directly connected with the other component or intervening components may also be present. In contrast, it will be understood that when a component is referred to as being "directly connected with" another component, there are no intervening components present.

A singular representation may include a plural representation unless it represents a definitely different meaning from the context.

In the present application, terms such as "include", "has", and the like should be understood that they are intended to indicate an existence of features, numbers, steps, operations, components, parts, or combinations thereof described in the specification, but do not preclude the presence or possibility of addition of one or more other features, numbers, steps, operations, components, parts, or combinations thereof in advance.

Figure 1:
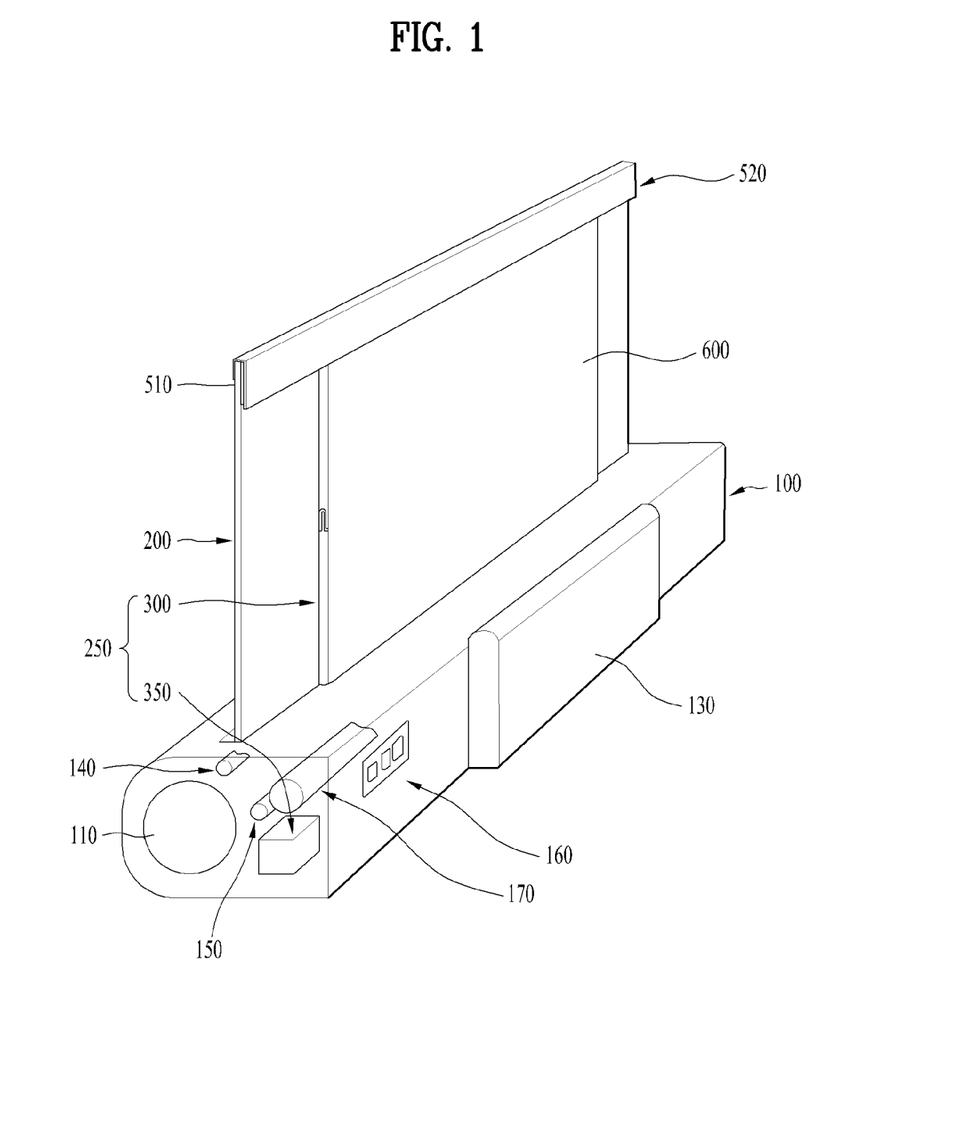
FIG. 1 illustrates a rollable display device associated with the present disclosure.

FIG. 1 illustrates a rollable display device associated with the present disclosure.

Referring to FIG. 1, a rollable display device may include a main body 100, a soft display panel 200, and a link assembly 300.

The main body 100 may provide a space defined therein in which the soft display panel 200 and the link assembly 300 may be accommodated. For example, the main body 100 may include a main roller 110 on which the soft display panel 200 is wound and a link actuator 350 for actuating the link assembly 300. The main body 100 may further include a set power board box 130 for supplying a signal for realizing an image on the soft display panel 200. The set power board box 130 may be located on a rear face of the main body 100.

The main roller 110 may be cylindrical. The soft display panel 200 may be wound along an outer face of the main roller 110. For example, a lower end of the soft display panel 200 may be coupled to the main roller 110. The main roller 110 may prevent the soft display panel 200 from being damaged during an unwinding operation and/or a winding operation of the soft display panel 200. For example, the main body 100 may further include an elastic member for rotating the main roller 110 in a state in which the soft display panel 200 is completely wound on the main roller 110. The elastic member may include a spring.

The main body 100 may further include auxiliary rollers 140 and 150 to assist a movement of the soft display panel 200. For example, a front face of the soft display panel 200 wound on the main roller 110 may be in contact with a front face auxiliary roller 140, and a rear face of the soft display panel 200 may be in contact with a rear face auxiliary roller 150. Vertical levels of the front face auxiliary roller 140 and the rear face auxiliary roller 150 may be different.

The link actuator 350 may pivot/move the link assembly 300 to ascend or descend an upper end of the soft display panel 200. The soft display panel 200 wound on the main roller 110 may be fully unwound by the link actuator 350. The soft display panel 200 which has been completely unwound may move toward the main roller 110 by the link actuator 350. The soft display panel 200 moved toward the main roller 110 by the link actuator 350 may be wound along the outer face of the main roller 110 by a rotation of the main roller 110.

The main body 100 may further include a control panel 160 for controlling the link actuator 350. The control panel 160 may be located on a rear face of the main body 100.

The soft display panel 200 may be a display panel that realizes the image and has flexibility. For example, the soft display panel 200 may include a first flexible substrate and a second flexible substrate bonded to the first flexible substrate. A light emitting element or light transmittance adjusting means may be positioned between the first flexible substrate and the second flexible substrate. For example, the soft display panel 200 may be an OLED panel including an organic light emitting layer.

The link assembly 300 may be connected to the link actuator 350. The link assembly 300 may be pivoted/moved by the link actuator 350 to ascend or descend the upper end of the soft display panel 200. For example, the link assembly 300 may connect the link actuator 350 and the upper end of the soft display panel 200 with each other.

The link assembly 300 may be located on the rear face of the soft display panel 200. The rollable display device may further include a back cover 600 for hiding an operation of the link assembly 300. The link assembly 300 may operate between the soft display panel 200 and the back cover 600.

Figure 2:
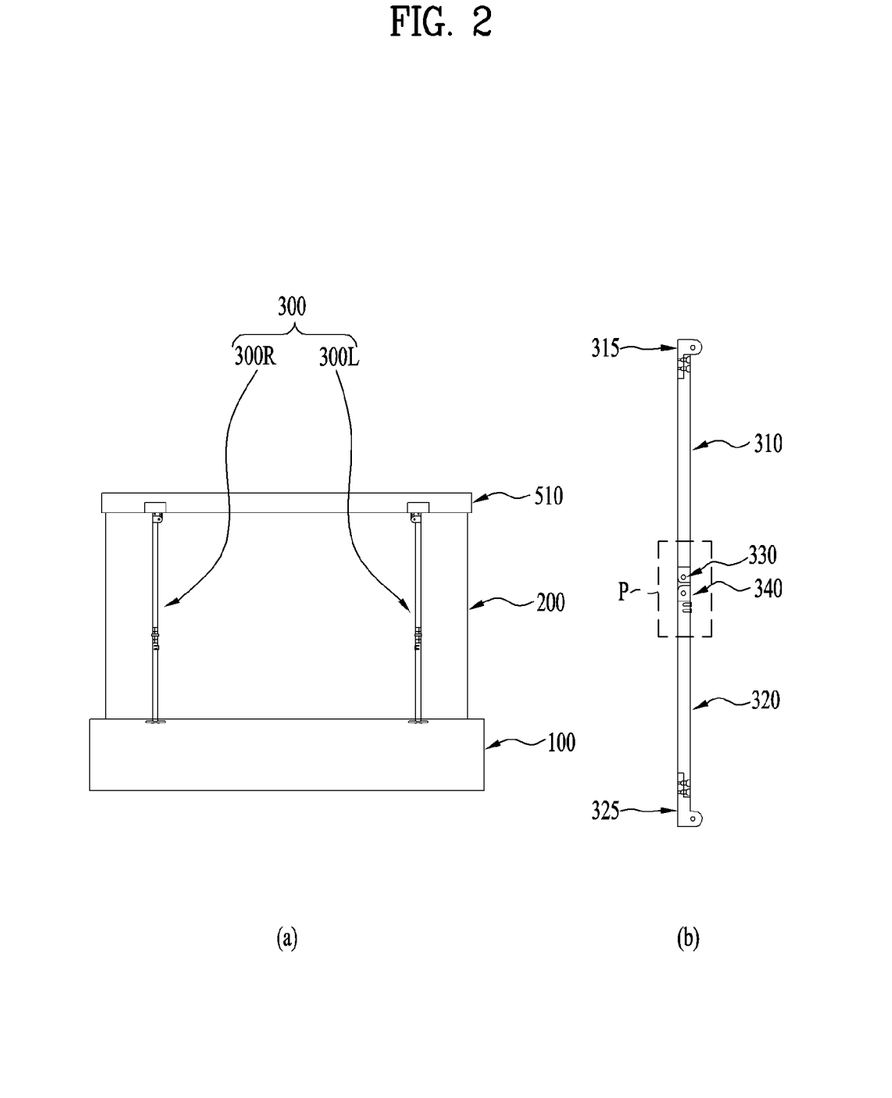
FIG. 2 illustrates a rear face and a first link assembly of a rollable display device associated with the present disclosure.

FIG. 2 illustrates a rear face and a first link assembly of a rollable display device associated with the present disclosure.

(a) in FIG. 2 illustrates a rear face of the rollable display device. Further, (b) in FIG. 2 illustrates a first link assembly 300R of the rollable display device when the soft display panel is fully unwound.

Referring to FIG. 1 and (a) and (b) in FIG. 2, the link assembly 300 of the rollable display device may include the first link assembly 300R and a second link assembly 300L.

The first link assembly 300R and the second link assembly 300L may be respectively located close to side faces of the soft display panel 200 that face each other. For example, the first link assembly 300R may be located close to a left side face of the rear face of the soft display panel 200, and the second link assembly 300L may be located closer to a right side face of the rear face of the soft display panel 200 based on the drawing shown in (a) in FIG. 2.

When the soft display panel 200 is fully unwound, the link assembly 300 may have an I shape. For example, when the soft display panel 200 is fully unwound, the link assembly 300 may completely fill a space between the soft display panel 200 and the back cover 600. When the soft display panel 200 is fully unwound, an empty space may be defined between the soft display panel 200, the link assembly 300, and the back cover 600.

The rollable display device includes the link assembly 300 having the I shape when the soft display panel 200 is fully unwound. Accordingly, the rollable display device according to an embodiment of the present disclosure may not require a separate finishing action on the side face. Thus, in the rollable display device according to an embodiment of the present disclosure, the side face may be slimmed.

The first link assembly 300R may include an upper link frame 310, a lower link frame 320, a center link joint 330, and an elastic plate 340. The second link assembly 300L may have the same configuration as the first link assembly 300R. For example, the second link assembly 300L may be symmetrical with the first link assembly 300R.

The rollable display device will be described as the first link assembly 300R and the second link assembly 300L being symmetrical. However, in the rollable display device, the second link assembly 300L may have the same shape as the first link assembly 300R. For example, in the rollable display device, the first link assembly 300R and the second link assembly 300L may pivot in the same direction by a link actuator 230.

The lower link frame 320 may connect the link actuator 350 and the center link joint 330 with each other. For example, the lower link frame 320 may include a lower end link bracket 325 for connecting with the link actuator 350.

The lower link frame 320 may be pivoted by the link actuator 350. The link actuator 350 may pivot the lower link frame 320 on the rear face of the soft display panel 200 via the lower end link bracket 325. For example, when the fully unwound soft display panel 200 is wound, an upper end of the lower link frame 320 may move toward a center of the soft display panel 200 by the link actuator 350.

The upper link frame 310 may connect the upper end of the soft display panel 200 and the center link joint 330 with each other. For example, the upper link frame 310 may include an upper end link bracket 315 for connecting with the upper end of the soft display panel 200.

Figure 3:
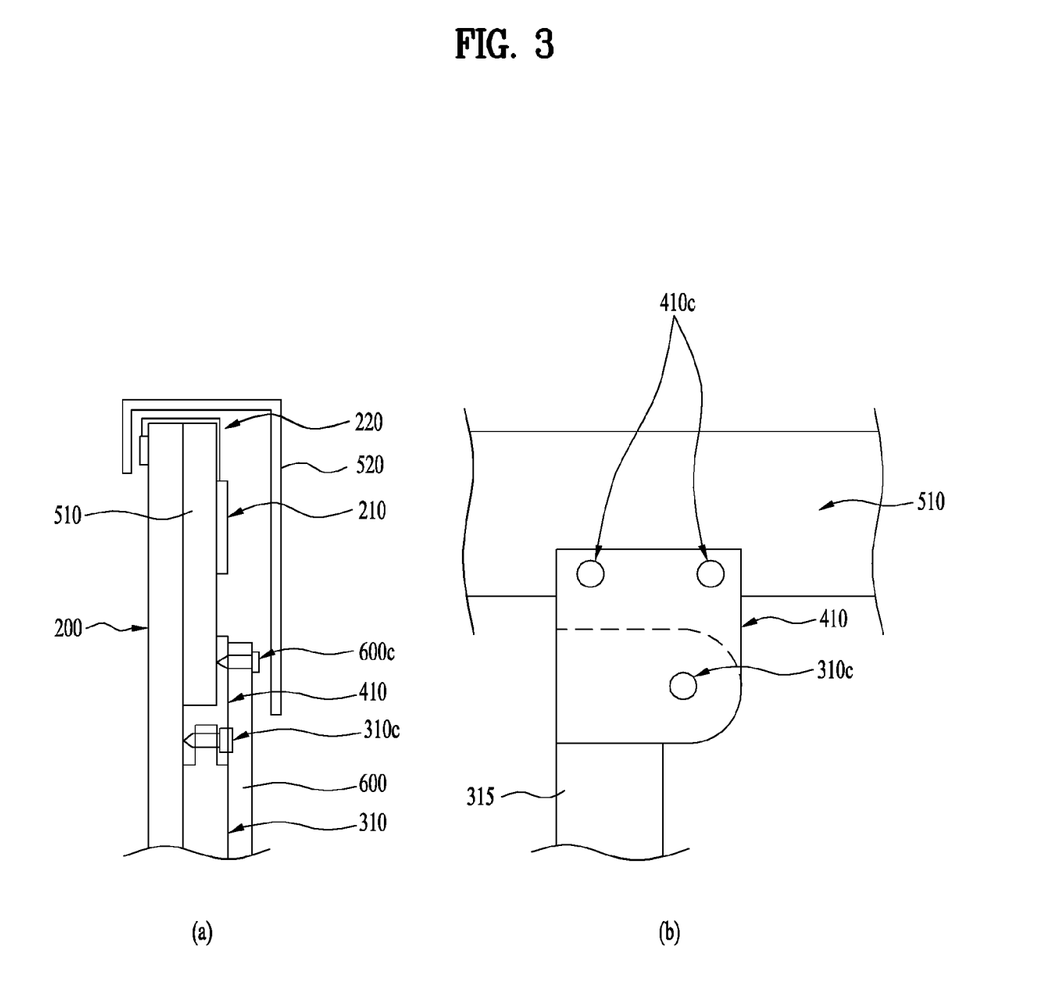
FIG. 3 is a diagram illustrating a connection relationship between an upper end of a soft display panel and an upper link frame of a rollable display device associated with the present disclosure.

FIG. 3 is a diagram illustrating a connection relationship between the upper end of the soft display panel 200 and the upper link frame 310 of the rollable display device.

(a) in FIG. 3 is a cross-sectional view of the upper end of the soft display panel. Further, (b) in FIG. 3 illustrates a rear face of the upper end of the soft display panel.

Referring to (a) and (b) in FIG. 1, and (a) and (b) in FIG. 3, the rollable display device according to an embodiment of the present disclosure may include a top support 510 located at an upper end of the rear face of the soft display panel 200 and a support bracket 410 positioned between the top support 510 and the upper link frame 310.

The support bracket 410 may be fixed to the top support 510 by a support fixing pin 410c. The back cover 600 may cover the support bracket 410. For example, an upper end of the back cover 600 may be coupled to the top support 510 by a cover fixing pin 600c.

The back cover 600 may ascend or descend together with the soft display panel 200. The back cover 600 may be accommodated in the main body 100. For example, the main body 100 may further include a cover roller 170 on which the back cover 600 is wound and the elastic member for rotating the cover roller 170.

The upper end of the soft display panel 200 may ascend or descend together with the top support 510. For example, the soft display panel 200 may be mounted to the top support 510 using a connection member 220, such as a flexible printed circuit board (FPCE), a tape carrier package (TCP), or the like connected to a circuit board 210 for transmitting a driving signal and a power signal to a display region. The rollable display device according to an embodiment of the present disclosure may further include a top cap 520 for covering the connection member 220 and the top support 510.

The rollable display device is described as the back cover 600 is fixed to the support bracket 410. However, in the rollable display device according to another embodiment of the present disclosure, the back cover 600 may be fixed to the top support 510 or the top cap 520.

The upper end link bracket 315 of the upper link frame 310 may be coupled to the support bracket 410 by an upper end fixing pin 310c. A lower end of the upper link frame 310 may pivot in a direction of the center of the soft display panel 200 with respect to the upper end fixing pin 310c.

A connection or coupling relationship between the upper end of the soft display panel 200 of the rollable display device and the upper link frame 310 is not limited to the above embodiment. For example, the upper end of the soft display panel may be coupled with a cover member formed integrally to be connected to a member for ascending and descending the soft display panel, such as the upper link frame.

Hereinafter, embodiments of the present disclosure will be described using a rollable display device illustrated in FIG. 4 as an example. However, in one example, the rollable display device according to an embodiment of the present disclosure may be implemented as the rollable display device illustrated in FIGS. 1 to 3. Hereinafter, various embodiments of the present disclosure will be described in detail with reference to FIGS. 4 to 8, and may be supplementally interpreted with reference to FIGS. 1 to 3 above.

Figure 4:
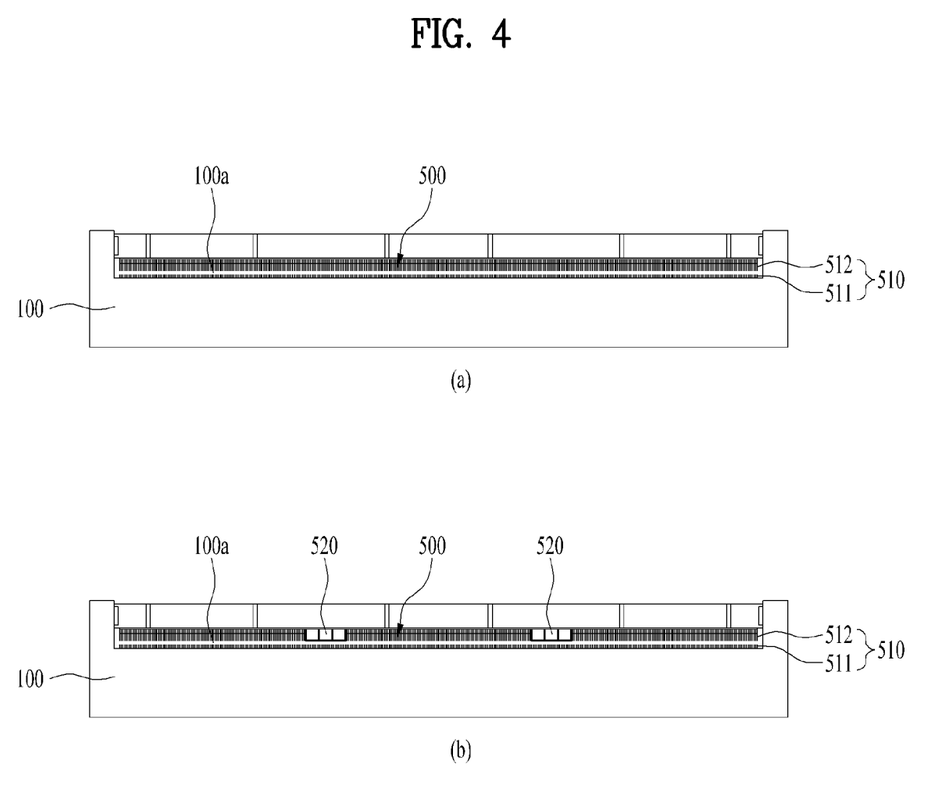
FIG. 4 is a view illustrating a rollable display device according to an embodiment of the present disclosure viewed from above.

FIG. 4 is a view illustrating a rollable display device according to an embodiment of the present disclosure viewed from above.

(a) in FIG. 4 illustrates a rollable display device having a brush 510 according to an embodiment of the present disclosure. (b) in FIG. 4 illustrates a rollable display device having the brush 510 and a rubber portion 520 according to an embodiment of the present disclosure. In (a) and (b) in FIG. 4, the soft display panel 200, the main roller 110, and the actuator 250 are accommodated in the housing 100 and not visible.

Referring to FIGS. 1 to 4, the rollable display device according to the present disclosure includes the soft display panel 200, the main roller 110, the actuator 250, the housing 100, and an elastic portion 500.

The soft display panel 200 may be the display panel that realizes the image and has the flexibility. For example, the soft display panel 200 may be a flexible organic light emitting display panel, a flexible light emitting diode display panel, a flexible electrophoretic display panel, or the like. The soft display panel 200 may ascend and descend in a vertical direction by being wound onto or unwound from the main roller 110.

The main roller 110 winds or unwinds the soft display panel 200.

The actuator 250 is coupled with the soft display panel 200 to ascend and descend the soft display panel 200. For example, one end of the actuator 250 is connected to the upper end of the soft display panel 200 and the other end of the actuator 250 is fixed to the housing 100, so that the soft display panel 200 may be ascended and descended through an opening 100a of the housing 100 to be described later. The actuator 250 may be retracted and extended through the opening 100a in conjunction with the soft display panel 200. The actuator 250 may include the link actuator 350 and the link assembly 300 of FIGS. 1 to 3. A structure for ascending and descending the soft display panel 200 may be variously implemented, and is not limited to the embodiment of FIGS. 1 to 3.

The housing 100 mounts the main roller 110 therein. The housing 100 may provide the space in which the soft display panel 200 and the link assembly 300 may be accommodated. A top of the housing 100 may have the opening 100a defined therein for retracting and extending the soft display panel 200. The housing 100 may be implemented as the main body of FIGS. 1 to 3, but is not limited to the embodiment of FIGS. 1 to 3.

Referring to FIG. 1, and (a) and (b) in FIG. 4, the opening 100a may be elongated in a first direction corresponding to a width of the soft display panel 200 in the top of the housing 100. The soft display panel 200 or the actuator 250 may be retracted or extended through the opening 100a as the soft display panel 200 ascends and descends. The elastic portion 500 that covers at least a portion of the opening 100a may be disposed along a perimeter of the opening 100a.

Referring to FIGS. (a) and (b) in FIG. 4, the elastic portion 500 is protruded such that one end of the elastic portion 500 is coupled to the perimeter of the opening 100a and covers at least the portion of the opening 100a. In this connection, the elastic portion 500 may protrude in a second direction perpendicular to the first direction. The elastic portion 500 covers the gap between the soft display panel 200 and the housing 100 when the soft display panel 200 is retracted and extended. The elastic portion 500 may be made of an elastically deformable material to allow the soft display panel 200 or the actuator 250 to pass through the opening 100a. The elastic portion 500 may be disposed on both sides of the opening 100a along the first direction to have a predetermined length, and may define a gap through which the soft display panel 200 passes in a center of the opening 100a. The elastic portion 500 may include the brush 510 and the rubber portion 520.

For convenience of description, a downward direction in (a) and (b) in FIG. 4 is referred to as a direction of a front face of the soft display panel 200 and an upward direction is referred to as a direction of a rear face of the soft display panel 200.

Referring to (a) in FIG. 4, the brush 510 may be formed such that a plurality of bristles are directed inward of the opening 100a. When the soft display panel 200 is retracted and extended through the opening 100a, the brush 510 may include a first brush 511 covering a gap between the front face of the soft display panel 200 and the housing 100, and a second brush 512 covering a gap between the rear face of the soft display panel 200 and the housing 100. In this connection, when the actuator 250 is disposed in the direction of the rear face of the soft display panel 200, as the gap between the rear face of the soft display panel 200 and the housing 100 increases, the second brush 512 may be formed longer than the first brush 511.

Referring to (b) in FIG. 4, the rubber portion 520 is made of a flat, thin, and plate-shaped member, and one end of the rubber portion 520 is coupled to the perimeter of the opening 100a. The rubber portion 520 may have a predetermined length along the first direction to cover at least a portion of the opening 100a.

Referring to (a) and (b) in FIG. 4, the rollable display device may include only the brush 510 or only the rubber portion 520 along the perimeter of the opening 100a. Alternatively, the rollable display device may include the brush 510 along a portion of the perimeter of the opening 100a and the rubber portion 520 along a remaining portion of the perimeter of the opening 100a. As will be described later, the rubber portion 520 may be disposed at a position corresponding to the actuator 250. For example, the actuator 250 may be disposed in the direction of the rear face of the soft display panel 200, and the rubber portion 520 may be disposed between bristles of the second brush 512. The rubber portion 520 may be made of an elastically deformable silicone material or a silicone coated material.

Figure 5:
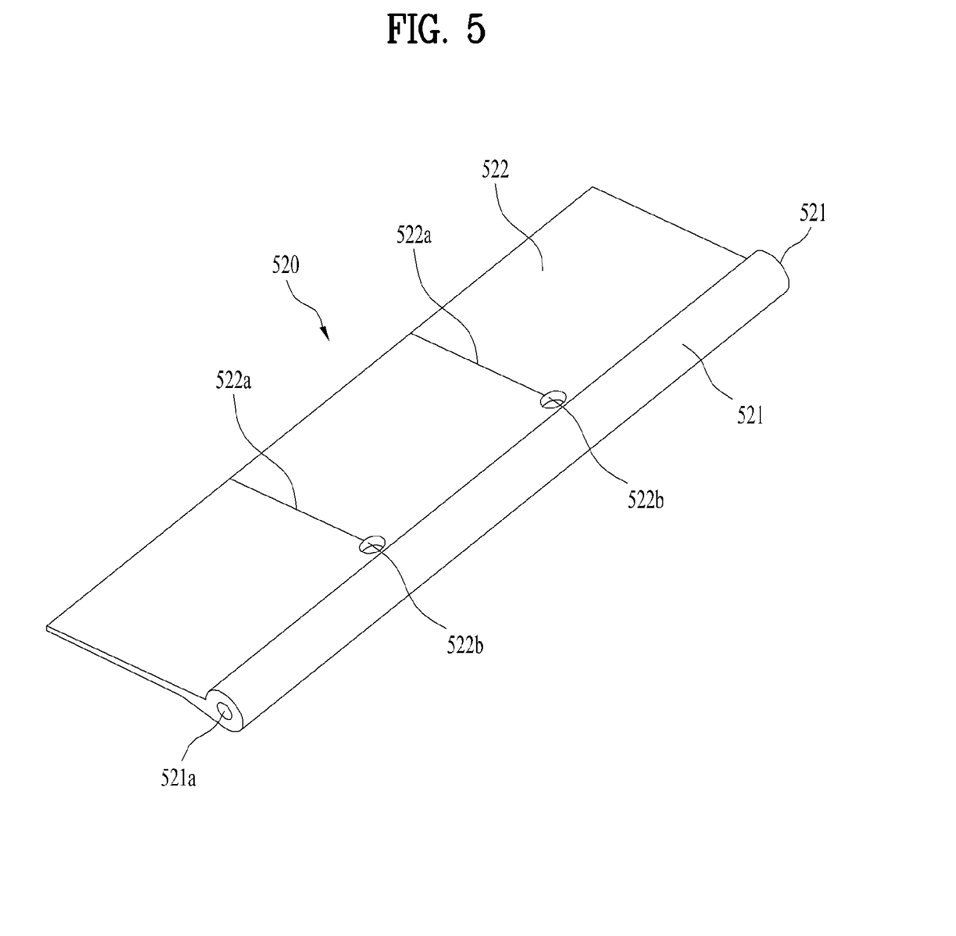
FIG. 5 illustrates a rubber portion of a rollable display device according to an embodiment of the present disclosure.

FIG. 5 illustrates the rubber portion 520 of the rollable display device according to an embodiment of the present disclosure.

Referring to FIG. 5, the rubber portion 520 includes a connecting portion 521 and a wing portion 522.

The connecting portion 521 couples the wing portion 522 to the housing 100. The connecting portion 521 includes a hollow 521a defined therein and pivotably connects the wing portion 522 to the housing 100 to minimize a passage resistance of the soft display panel 200 or the actuator 250.

The wing portion 522 extends flatly from the connecting portion 521 to cover at least a portion of the opening 100a. For example, the wing portion 522 may be composed of a thin, flat, and plate-shaped member. A thickness of the wing portion 522 increases as the wing portion 522 becomes closer to the connecting portion 521. The wing portion 522 may include a cut 522a and a hole 522b defined therein.

The cut 522a cuts the wing portion 522 at predetermined spacings in an end direction from an arbitrary point inward side the wing portion 522 spaced a predetermined distance from an end of the wing portion 522, thereby minimizing the passage resistance of the soft display panel 200 or the actuator 250.

The hole 522b is defined at one end of the cut 522a located at the inward side of the wing portion 522 to prevent further tearing of the cut 522a because of continuous deformation.

Figure 6:
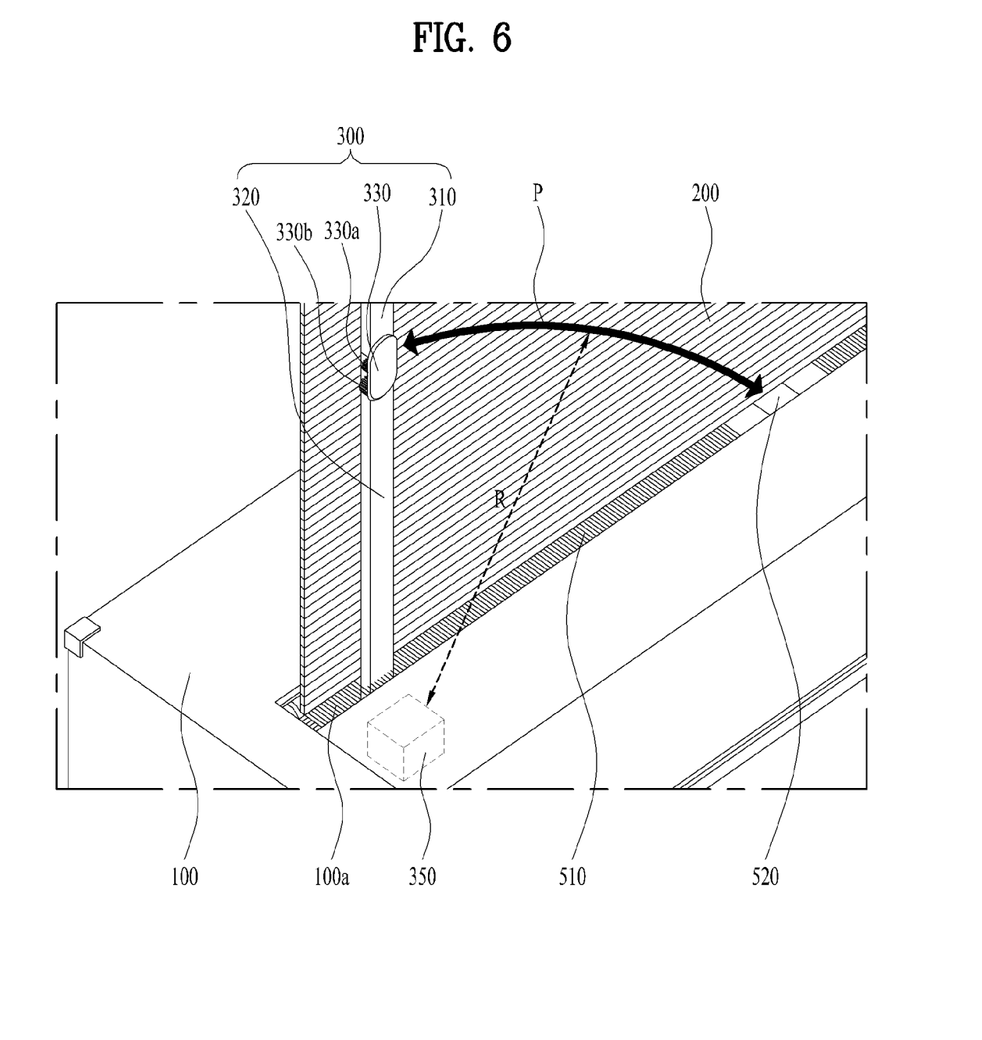
FIG. 6 is an enlarged view of one side of a top of a housing of a rollable display device according to an embodiment of the present disclosure.

FIG. 6 is an enlarged view of one side of a top of the housing 100 of the rollable display device according to an embodiment of the present disclosure.

Referring to FIGS. 1 to 3 and 6, the actuator 250 may further include the link assembly 300 and the link actuator 350.

The link assembly 300 pivots and moves by the link actuator 350 to ascend or descend the soft display panel 200. For example, one end of the link assembly 300 may be connected to the upper end of the soft display panel 200 and the other end of the link assembly 300 may be connected to the link actuator 350. The link assembly 300 may be disposed on the rear face of the soft display panel 200. The link assembly 300 may be mounted in the housing 100 to be retracted and extended through the opening 100a in conjunction with the soft display panel 200.

The link actuator 350 may pivot/move the link assembly 300 to ascend or descend the upper end of the soft display panel 200.

Referring to FIGS. 2 and 6, the link assembly 300 may be folded or unfolded based on the ascending and descending of the soft display panel 200. For example, when the link soft display panel 200 is completely unfolded, the link assembly 300 is in the I shape. In addition, when the soft display panel 200 is folded or being retracted or extended, the link assembly 300 is in an L shape. The link assembly 300 has a predetermined actuating path based on the ascending and descending of the soft display panel 200.

The link assembly 300 may include the upper link frame 310, the lower link frame 320, and the center link joint 330.

The upper link frame 310 has an upper end pivotably connected to an upper portion of the soft display panel 200.

The lower link frame 320 has a lower end pivotably connected to the link actuator 350. Specifically, the lower link frame 320 may be pivoted in the first direction by the link actuator 350 with respect to the lower end.

The link joint 330 connects a lower end of the upper link frame 310 and an upper end of the lower link frame 320 with each other. The link joint 330 forms a predetermined angle between the upper link frame 310 and the lower link frame 320 based on the ascending and descending of the soft display panel 200. The link joint 330 may include a first gear 330a positioned on the lower end of the upper link frame 310, and a second gear 330b positioned on the upper end of the lower link frame 320 and rotating in engagement with the first gear 330a.

The link joint 330 moves along a pivot path P having a predetermined pivot radius R with respect to the lower end of the lower link frame 320. Specifically, the upper link frame 310 and the lower link frame 320 pivot as the soft display panel 200 ascends or descends. For example, when the soft display panel 200 ascends, the lower link frame 320 may pivot in the first direction and the upper link frame 310 may pivot in the opposite direction of the first direction. In this connection, the link joint 330 pivots in the first direction with respect to the lower end of the lower link frame 320 and moves in a direction of an edge of the soft display panel 200. In another example, when the soft display panel 200 descends, the lower link frame 320 may pivot in the direction opposite to the first direction, and the upper link frame 310 may pivot in the first direction. In this connection, the link joint 330 pivots in the opposite direction of the first direction with respect to the lower end of the lower link frame 320 and moves to a direction of the center of the soft display panel 200.

Referring to FIG. 6, as described above, the rollable display device may include the brush 510 along the portion of the perimeter of the opening 100a and the rubber portion 520 along the remaining portion of the perimeter of the opening 100a. In this connection, the rubber portion 520 may be disposed at a position corresponding to the pivot path of the link joint 330. Alternatively, the rubber portion 520 may be disposed to cover a specific region of the opening 100a through which the link joint 330 passes. In this connection, the rubber portion 520 may have the predetermined length such that an end of the bristle of the adjacent brush 510 does not in contact with the link joint 330. For example, the length of the rubber portion 520 in the first direction may be larger than a length of the link joint 330 in the first direction. This is to prevent malfunction of the actuator 250 and transfer of lubricant such as the grease by preventing the end of the bristle of the brush 510 disposed adjacent to the specific region from entering between the first gear 330a and the second gear 330b of the link joint 330.

According to an embodiment of the present disclosure, the rollable display device of the present disclosure may block external foreign substances by minimizing exposure of the interior of the housing when the soft display panel is retracted and extended.

According to another embodiment of the present disclosure, the rollable display device of the present disclosure may prevent the brush from entering the actuating member ascending and descending the soft display panel.

It is apparent to those skilled in the art that the present disclosure may be embodied in other specific forms without departing from the spirit and essential features of the present disclosure.

Thus, the foregoing detailed description should not be construed as limiting in all respects but considered as illustrative. The scope of the present disclosure should be determined by reasonable interpretation of the appended claims, and all changes that fall within the equivalent scope of the present disclosure are included in the present disclosure.

What is claimed is:

1. A rollable display device comprising:
    a soft display panel;
    a main roller for winding or unwinding the soft display panel;
    an actuator coupled to the soft display panel to raise or lower the soft display panel and including a link joint;
    a housing in which the main roller is mounted, wherein an opening extending in a first direction is defined at a top of the housing to allow the soft display panel to retract or extend therethrough; and
    a rubber portion having one end coupled to a perimeter of the opening and protruding to cover a first portion of the opening,
    wherein the rubber portion includes a portion having a predetermined length along the first direction, and
    wherein the link joint of the actuator moves through the rubber portion when the soft display panel is retracted or extended through the opening of the housing.

2. The rollable display device of claim 1, wherein the rubber portion protrudes in a second direction perpendicular to the first direction.

3. The rollable display device of claim 1, wherein the rubber portion includes:
    a connecting portion coupled to the housing; and
    a wing portion flatly extending from the connecting portion to cover the first portion of the opening.

4. The rollable display device of claim 3, wherein a thickness of the wing portion increases along a direction leading towards the connecting portion.

5. The rollable display device of claim 3, wherein the wing portion has at least one cut defined therein extending from an end of the wing portion toward the connecting portion.

6. The rollable display device of claim 3, wherein the connecting portion has a hollow defined therein to pivotably connect an end of the wing portion to the housing.

7. The rollable display device of claim 1, wherein the actuator includes:
- a link assembly retractable and extendable through the opening in conjunction with the soft display panel; and
- a link actuator for actuating the link assembly to raise or lower the soft display panel,
wherein the link assembly includes:
- an upper link frame having an upper end connected to an upper portion of the soft display panel;
- a lower link frame having a lower end connected to the link actuator; and
- the link joint for connecting a lower end of the upper link frame and an upper end of the lower link frame, wherein the link joint forms a predetermined angle between the upper link frame and the lower link frame as the soft display panel is raised or lowered.

8. The rollable display device of claim 7, wherein the link joint moves along a pivot path having a predetermined pivot radius with respect to the lower end of the lower link frame, and
wherein the rubber portion is located on the pivot path of the link joint.

9. The rollable display device of claim 8, further comprising a brush having one end coupled to the perimeter of the opening and having a plurality of bristles for covering a second portion of the opening.

10. The rollable display device of claim 9, wherein the link joint includes:
- a first gear positioned on the lower end of the upper link frame; and
- a second gear positioned on the upper end of the lower link frame and configured to rotate in engagement with the first gear, and
wherein the length of the rubber portion along the first direction is larger than a length of the link joint along the first direction.

11. A rollable display device comprising:
- a soft display panel;
- a main roller for winding or unwinding the soft display panel;
- a link assembly comprising an upper link frame and a lower link frame and a link joint for connecting a lower end of the upper link frame and an upper end of the lower link frame;
- a link actuator for actuating the link assembly to raise or lower the soft display panel;
- a housing in which the main roller is mounted, wherein an opening extending in a first direction is defined at a top of the housing to allow the soft display panel to retract or extend therethrough; and
- a rubber portion having one end coupled to a perimeter of the opening and protruding to cover a first portion of the opening,
wherein the link joint forms a predetermined angle between the upper link frame and the lower link frame as the soft display panel is raised or lowered and moves along a pivot path having a predetermined pivot radius with respect to the lower end of the lower link frame, and
wherein the rubber portion is located on the pivot path of the link joint.

12. The rollable display device of claim 11, further comprising a brush having one end coupled to the perimeter of the opening and having a plurality of bristles for covering a second portion of the opening.

13. The rollable display device of claim 11, wherein a length of the rubber portion along the first direction is larger than a length of the link joint along the first direction.

14. The rollable display device of claim 11, wherein the rubber portion protrudes in a second direction perpendicular to the first direction.

15. The rollable display device of claim 11, wherein the rubber portion includes:
- a connecting portion coupled to the housing; and
- a wing portion flatly extending from the connecting portion to cover the first portion of the opening.

16. The rollable display device of claim 15, wherein a thickness of the wing portion increases along a direction leading towards the connecting portion.

17. The rollable display device of claim 15, wherein the wing portion has at least one cut defined therein extending from an end of the wing portion toward the connecting portion.

18. The rollable display device of claim 15, wherein the connecting portion has a hollow defined therein to pivotably connect an end of the wing portion to the housing.

19. A rollable display device comprising:
- a soft display panel;
- a main roller for winding or unwinding the soft display panel;
- a link assembly comprising an upper link frame and a lower link frame and a link joint forming a predetermined angle between the upper link frame and the lower link frame;
- a link actuator for actuating the link assembly to raise or lower the soft display panel;
- a housing in which the main roller is mounted, wherein an opening extending in a first direction is defined at a top of the housing to allow the soft display panel to retract or extend therethrough;
- a rubber portion having one end coupled to a perimeter of the opening and protruding to cover a first portion of the opening; and
- a brush having one end coupled to a first perimeter of the opening and having a plurality of bristles for covering a second portion of the opening,
wherein the link joint moves along a pivot path through the first portion of the opening.

* * * * *